United States Patent
Ho et al.

(10) Patent No.: US 8,024,623 B2
(45) Date of Patent: Sep. 20, 2011

(54) MISALIGNMENT COMPENSATION FOR PROXIMITY COMMUNICATION

(75) Inventors: Ronald Ho, Mountain View, CA (US);
Ashok V. Krishnamoorthy, San Diego, CA (US); John E. Cunningham, San Diego, CA (US); Robert J. Drost, Los Altos, CA (US)

(73) Assignee: Oracle America, Inc., Redwood Shores, CA (US)

( * ) Notice: Subject to any disclaimer, the term of this patent is extended or adjusted under 35 U.S.C. 154(b) by 263 days.

(21) Appl. No.: 12/263,713

(22) Filed: Nov. 3, 2008

(65) Prior Publication Data

US 2010/0115349 A1 May 6, 2010

(51) Int. Cl.
*G11B 5/00* (2006.01)

(52) U.S. Cl. ............ 714/700; 714/47; 327/51; 327/199; 327/201; 324/500; 438/107; 29/834; 385/14; 375/256; 700/114

(58) Field of Classification Search .................. None
See application file for complete search history.

(56) References Cited

U.S. PATENT DOCUMENTS

| | | | |
|---|---|---|---|
| 5,912,925 A * | 6/1999 | Palermo et al. | 375/258 |
| 6,396,308 B1 * | 5/2002 | Bosnyak et al. | 327/51 |
| 6,916,719 B1 * | 7/2005 | Knight et al. | 438/381 |
| 7,148,074 B1 * | 12/2006 | Drost et al. | 438/15 |
| 7,200,830 B2 * | 4/2007 | Drost et al. | 716/12 |
| 7,535,958 B2 * | 5/2009 | Best | 375/239 |
| 7,551,815 B2 * | 6/2009 | Welch et al. | 385/24 |
| 7,750,709 B1 * | 7/2010 | Schauer et al. | 327/264 |
| 2003/0099210 A1 * | 5/2003 | O'Toole et al. | 370/311 |
| 2004/0225461 A1 * | 11/2004 | Floyd et al. | 702/85 |
| 2004/0227221 A1 * | 11/2004 | Harris et al. | 257/686 |
| 2006/0187885 A1 * | 8/2006 | Roy et al. | 370/332 |
| 2007/0001270 A1 * | 1/2007 | Sukegawa et al. | 257/664 |

OTHER PUBLICATIONS

Drost et al., Proximity Communication, 2004, IEEE, 0018-9200, pp. 1529-1535.*

* cited by examiner

*Primary Examiner* — John P Trimmings
(74) *Attorney, Agent, or Firm* — Park, Vaughan, Fleming & Dowler LLP

(57) ABSTRACT

In a proximity communication system, transmit elements on one chip are aligned with receive elements on a second chip juxtaposed with the first chip. However, if the elements are misaligned, either statically or dynamically, the coupling between chips is degraded. The misalignment may be compensated by controllably degrading performance of the system. For example, the transmit signal strength may be increased. The bit period or the time period for biasing each bit may be increased, thereby decreasing the bandwidth. Multiple coupling elements, such as capacitors, may be ganged together, thereby decreasing the number of channels. The granularity of symbols, such as images, may be increased by decreasing the number of bits per symbol.

16 Claims, 8 Drawing Sheets

MISALIGNMENT COMPENSATION FOR PROXIMITY COMMUNICATION

BACKGROUND

1. Field of the Invention

This present invention relates to semiconductor chips and their alignment and fixing to another chip or substrate. The invention relates specifically to a method and apparatus for gracefully degrading performance of a proximity communication channel in response to misalignment of one or more semiconductor chips.

2. Related Art

Proximity communication (PxC) is a well known technology that enables communication between two integrated circuit chips, but that also relies upon face-to-face alignment of those chips, as has been explained by Drost et al. in "Proximity Communication," *IEEE Journal of Solid-State Circuits*, vol. 39, no. 9, September 2004, pp. 1529-1535. Misalignment between these two chips between which the proximity communication channel is formed may occur for a number of reasons, including but not limited to: inaccurate placement in a package or on a printed circuit board (PCB) or other carrier substrate; temperature variations leading to thermal expansion or contraction; or mechanical displacement, including stress deformation or vibration. Any misalignment between chips will reduce the effectiveness of face-to-face proximity communication, whether that communication is moderated through capacitive coupling, inductive coupling, optical coupling, or a direct conductive path.

Methods have been described in the prior art for automatically detecting and correcting for this misalignment, such as U.S. Published Patent Application 2007/0266557 to Drost et al. The misalignment detection uses a mechanism for determining chip position and is not covered here. Also, the prior art teaches how to automatically correct for misalignment, using piezo-electric, electro-static, electro-thermal, or inductive actuators to adjust the chips, such as U.S. Published Patent Application 2004/0227221 to Harris et al. Although such actuators may be effective in some situations to correct misalignment, they are often difficult and expensive to implement.

However, the prior art has failed to teach a method of gracefully degrading the link performance in response to chip misalignment without necessarily realigning the chips. This degradation may take the form of slowing down the data rate of the channel, increasing the latency in the channel, or increasing the power used by the channel.

SUMMARY

One aspect of the present invention provides a method and system that compensates for misalignment and other reductions in signal strength between the transmit and receive chips in a proximity communication system by controlled degradation of the performance of the system. The coupling circuit between the transmit and receive chips may be capacitive, inductive, conductive, or optical.

Many of the techniques for compensating for misalignment can be characterized as electronic mechanisms for controlling the signal processing procedure or transmission process rather than any physical compensation or adjustment of the transmission elements.

In some embodiments, the signal level of the transmitted signal is increased with increasing misalignment.

In one embodiment including variable signal level, the transmit chip may include multiple amplifying circuits of different signal level, for example transistor drive circuits connected to different power supply voltages. Only one of the circuits is selected dependent upon the degree of signal loss.

In another embodiment including variable signal level, the gain of an amplifying circuit on the transmit chip is controlled by a variable circuit element, such as a variable capacitor in the bootstrap circuit.

In another set of embodiments, the data rate is reduced to accommodate decreased signal level or misalignment.

In one embodiment based on reduced data rate, the increased bit period is used to increase the offset compensation of the receiver. The offset compensation may include a resistive drain or a pre-charging of the receiver amplifier.

In another embodiment, the received signal is used to actively drive a metal layer capacitively coupled to the receive element or its interconnect to the receiver. The drive may be in the form of a source follower.

In yet another embodiment, more error correction coding is included in the transmitted data word.

In still another embodiment, one or more neighboring channel is turned off to reduce cross talk arising from misalignment.

In some embodiments, the data granularity is increased for loss of signal strength.

In one embodiment of variable granularity involving pulse width modulation (PWM), the number of signal bits determining the width of a PWM is reduced. Alternatively, the width of the PWM period is increased, thereby reducing the data rate.

In some embodiments, multiple transmit and receive elements are ganged together to transmit a common data signal between the chips.

In some embodiments of control of the degradation combinable with different embodiment of the types of control, a circuit dynamically detects increased or decreased misalignment between the proximity communication chips and accordingly degrades or improves performance of the proximity communication system.

DETAILED DESCRIPTION

The following description is presented to enable any person skilled in the art to make and use the invention and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown but is to be accorded the widest scope consistent with the principles and features disclosed herein.

A proximity communication channel between two chips requires the two chips to be accurately aligned face-to-face. Data can then be sent between the chips using either capacitive, inductive, conductive, or optical coupling means. Any chip misalignment will reduce the coupling between the two chips and lower the effectiveness of the communication. This misalignment may be corrected using either electrical or mechanical methods involving steering the data or moving the chips.

However, in certain cases, correcting the misalignment may not be possible. This may be because the data steering capability is insufficient for a particular design. It may also result from misalignment in the z-axis or in tilt about the x-axis or y-axis, for which data steering is not an effective remedy. In those cases, a design may lack mechanisms for moving the chips back into proper alignment, or such mechanisms may not have the desired range to correct the misalignment.

In these cases according to an aspect of the invention, the misalignment may be accepted and proximity communication may be purposefully degraded in a controlled fashion so as to still provide a viable communication channel, only with reduced performance, such as lower bandwidth (data rate), higher latency, or higher power. This degradation is called "graceful" because it still enables use of the data channel, only with reduced operating specifications. Several methods will be described for such purposeful and graceful degradation.

Increasing Power

A proximity communication channel may be degraded by requiring an increase in the transmit power per link. In a capacitively coupled channel, power can be increased by increasing the voltage swing at the transmitter, leading to an increased signal on the receiver, even under cases of misalignment between the transmitter and receiver. This technique can be viewed as communication on a noisy channel, where the noise on the channel is due to chip misalignment. Increasing the transmit power is analogous to "shouting louder" on the transmit side, thus increasing the signal-to-noise ratio.

Figure 1:
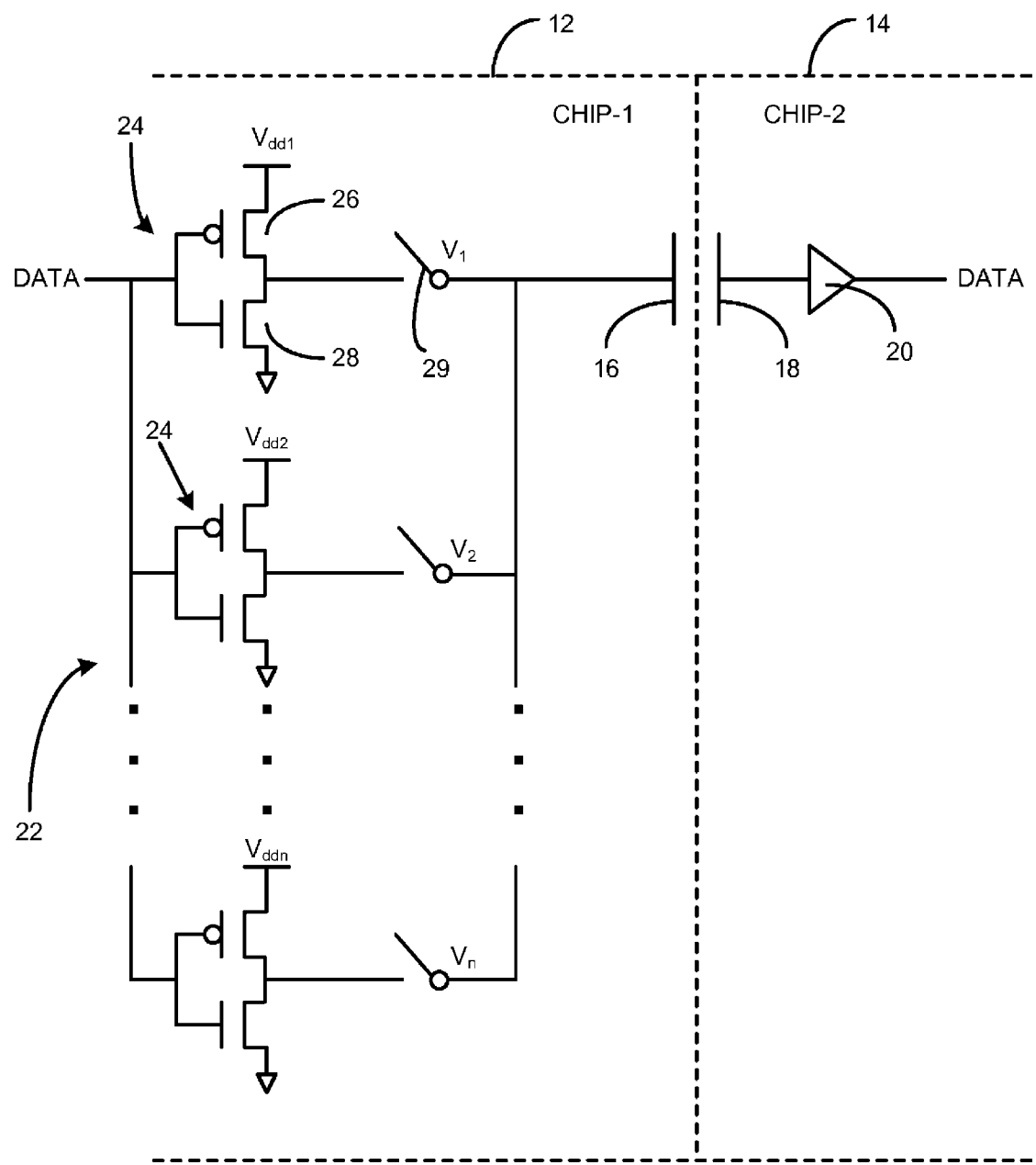
FIG. 1 is an electrical schematic in accordance with one embodiment of the present invention.

Ideally, the increased voltage swing at an output of the transmitter can be fine-tuned according to the misalignment between chips. However, a simpler method uses a few discrete voltage steps and achieves the same effect with very little loss in efficiency. In this exemplary implementation, the transmitter uses a multiplexer to select one of a few drivers, each with a different voltage swing. As soon as one voltage level is deemed inadequate, the next larger swing is chosen, even if that swing may be larger than required. On the other hand, if the coupling efficiency is improved and the presently selected voltage level is deemed excessive, the next smaller swing is chosen. An embodiment, illustrated in the circuit diagram of FIG. 1, includes a transmit chip 12 and a receive chip 14. The transmit chip 12 includes a transmit pad 16 formed at its surface but covered by a thin dielectric layer. Similarly, the receive chip 14 includes a receive pad 18 formed at its surface and covered by its own thin dielectric layer. The pads 16, 18 are electrically conductive plates so that, when the chips 12, 14 are juxtaposed and the pads 16, 18 are aligned, the pads 16, 18 form capacitor plates sandwiching a capacitive gap of the dielectric layer to form a capacitive coupling circuit between the chips 12, 14 to allow data to be transmitted between the chips 12, 14. It is understood that there may be many such capacitive coupling circuits in a dense one- or two-dimensional array, and that some circuits may be complementarily formed to that illustrated to provide bi-directional data transmission between the chips 12, 14. However, it is possible during juxtaposition of the chips 12, 14 that the two pads 16, 18 are not perfectly aligned so that the capacitive coupling circuit inefficiently couples the transmit side to the receive side. There are six degrees of freedom in the misalignment, for example, the x, y and z axes and rotation or twist about any of the axes. Aspects of the invention address the resultant degradation of signal transmission upon possibly any type of misalignment. Further, the capacitive coupling circuit may be substituted by inductive, conductive or optical coupling circuits, as described in more detail below. Any misalignment of the transmit and receive elements of these coupling circuits between the chips 12, 14 will likely degrade the transmission efficiency.

The receive chip 14 includes a receiver 20 to amplify the data signal received from its receive pad 18. In this embodiment of the invention, the transmit chip 12 includes a multiplexed transmitter 22 receiving the data signal and directing it to the gates of n CMOS drivers 24 of serially arranged pairs of a PMOS transistor 26 and an NMOS transistor 28 respectively coupled between ground and n power supply voltages Vdd1, Vdd2, . . . Vddn. The power supply voltages have different values, for example Vdd1<Vdd2< . . . <Vddn. The values of the DATA signal determine whether the output of the i-th CMOS driver 24 is Vddi or ground. The output of each CMOS driver 24 is gated through respective switches 29, labeled as v1, v2, . . . vn, only one of which is selected at any time to thereby determine the amplitude of the transmit signal. If the pads 16, 18 are perfectly aligned, the smallest transmit signal may be selected by closing (turning on) the v1 switch 29 so that the transmit amplitude is Vdd1. But, for increasing misalignment between the pads 16, 18, other switches 29 are selected for closing so that larger values of the power supply voltage Vddi are used. As a result, the transmit amplitude is increased for increased pad misalignment.

Figure 2:
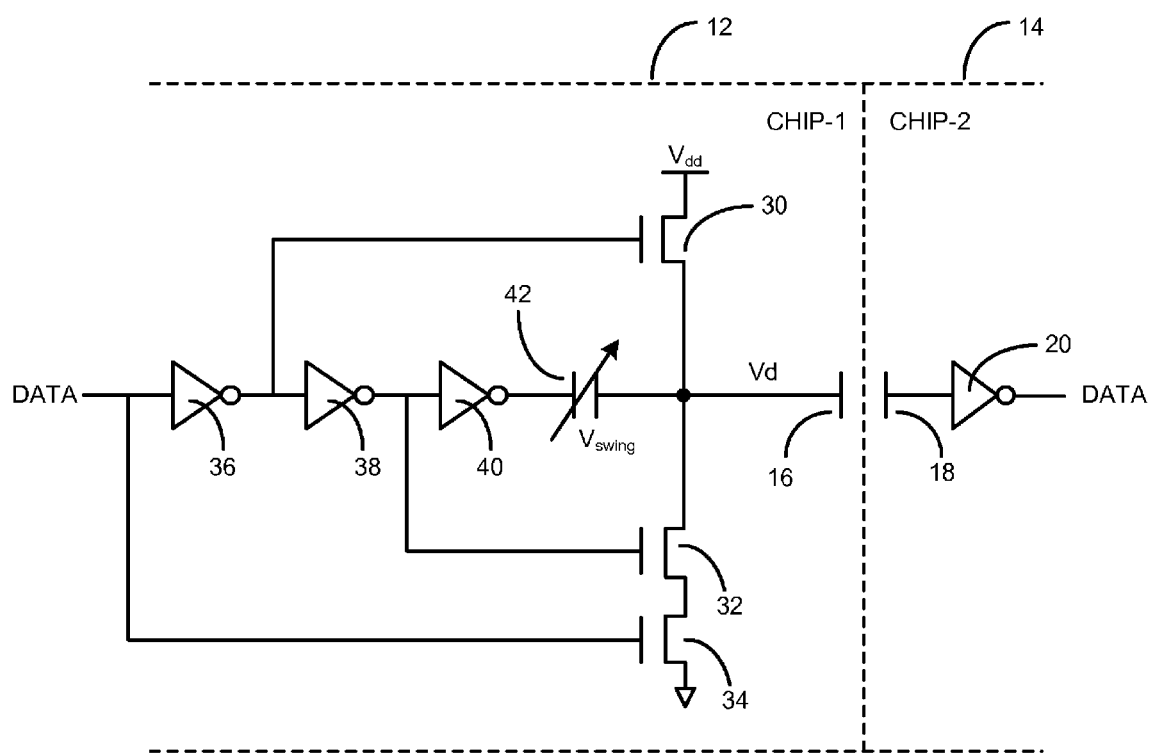
FIG. 2 is an electrical schematic in accordance with another embodiment of the invention.

Another method uses a variable bootstrap technique to increase the transmit voltage. Here, the transmitter sends a higher swing signal that can be adaptively tuned to the channel characteristics. One example of a simple example of bootstrap circuit is shown in the circuit diagram of FIG. 2, although many more examples of bootstrap circuits exist in the prior art. The transmitter includes three NMOS transistors 30, 32, 34 serially arranged between the power supply voltage Vdd and ground with an output node Vd between the first and second transistors 30, 32. The data signal is supplied through to three serially arranged inverters 36, 38, 40 and through a variable capacitor 42 to the output node Vd. The input data controls the gate of the third transistor 34. The output of the first inverter 36 controls the gate of the first transistor 30 and the output of the second inverter 38 controls the gate of the second transistor 32. If the data signal transitions high, then the transmitter grounds the near side of the capacitor 42. The two serially arranged transistors 32, 34 avoid crowbar, or rush-through, current. On the other hand, if the data signal transitions low, the first inverter 36 precharges the node Vd to within a threshold drop of the power supply voltage Vdd through the first NMOS transistor 30, and then the third inverter 40 kicks the voltage even higher, to a value set by the ratio of the variable capacitor 42 to the load and parasitic capacitances on that node Vd. Accordingly, as misalignment increases and a stronger transmit signal is needed, the value of the variable capacitor 42 can be increased, for example by using a varactor or by using parallel capacitors, each individually enabled, to compensate for the misalignment.

Figure 3:
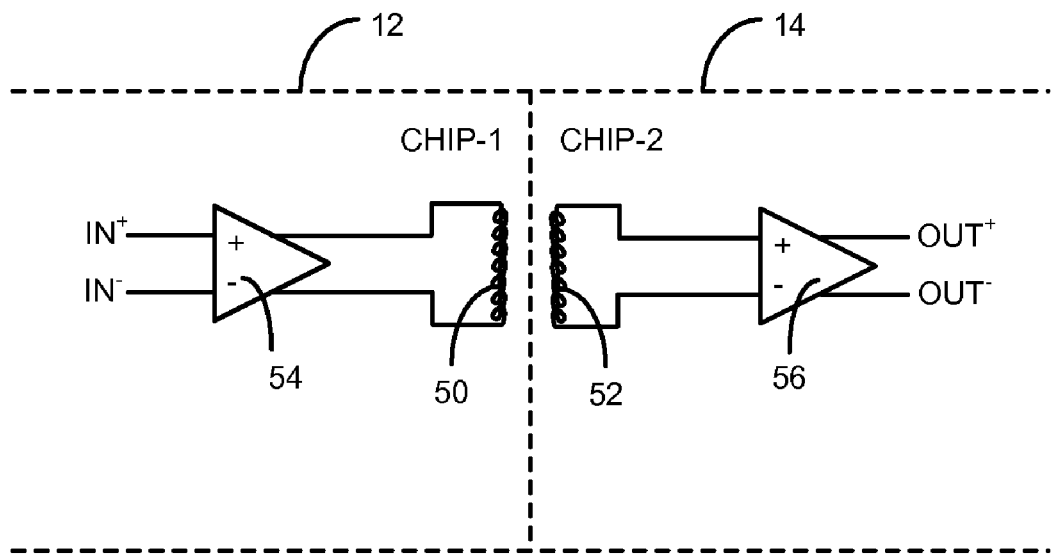
FIG. 3 is a circuit diagram of an inductively coupled proximity communication channel usable with many of the embodiments of the invention.
Figure 4:
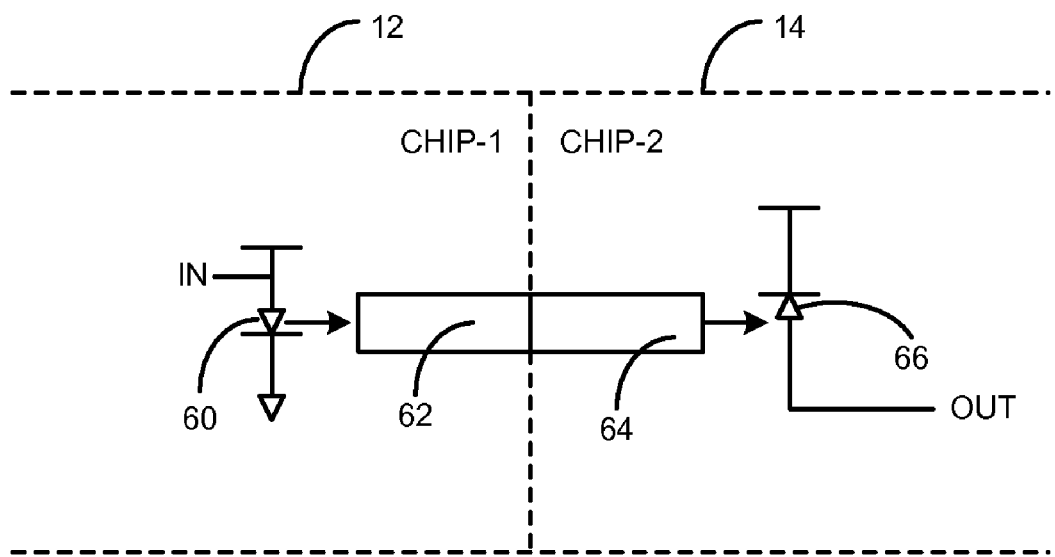
FIG. 4 is a circuit diagram of an optically coupled proximity communication channel usable with many of the embodiments of the invention.

Similar techniques can be applied to inductively coupled, conductively coupled, or optically coupled proximity communication channels as well. Such methods may use higher magnitude current pulses in the case of inductively or conductively coupled links, or higher-power lasers, for example, in the case of optically coupled links. An inductively coupled proximity communication system is illustrated in the circuit diagram of FIG. 3. Inductive coils 50, 52 are formed near the surfaces of two chips 12, 14 and are in close proximity, though electrically isolated from each other, when the chips 12, 14 are assembled. Preferably, a differential transmitter 54 has positive and negative inputs driven by complementary versions in+ and in− of the data signal and has complementary outputs connected across the transmit inductive coil 50. Similarly, a differential receiver 56 has positive and negative inputs connected to the receive inductive coil 52 and has complementary data outputs out+ and out−. An optically coupled proximity communication system is illustrated in the electrical schematic of FIG. 4. On the transmit chip 12, an electrical input data signal in drives a forward biased laser diode 60. The optical output of the laser diode 60 is captured in a transmit optical waveguide 62 and is coupled to a receiver optical waveguide 64 formed in the receive chip 14. The two waveguides 62, 64 or their coupling elements such as gratings are aligned to greater or lesser degree when the chips 12, 14 are assembled. The light in the receive waveguide 64 is guided to an optical detector, such as a reversed biased photodiode 66, which produces an electrical output signal out. A conductively coupled proximity communication system is similar to a capacitively coupled one, except the capacitors are replaced by electric contacts which touch each other to provide a conductive path between the chips 12, 14.

This type of compensating channel degradation by increasing the power can be the most desired because it still enables full data rate and lowest latency. As long as the system can maintain the increased power (and the increased current draw on secondary power supplies in the example above), the data communication is still at peak bandwidth and latency performance.

Increasing Latency

Another method of gracefully degrading the channel increases the time allocated per bit. For example, instead of running the proximity communication channel at 5 Gbps, we may choose to throttle it back to 4 Gbps. By increasing the time per bit, we enable either increased signal, reduced noise, or both. Note that increasing latency automatically decreases bandwidth, unless a form of pipelining is employed in the channel.

An associated of gracefully degrading the channel maintains the same bit-wise data rate but increases the amount of error correction code incorporated into the signal. For example, if every transmitted data word is encoded at the transmitter to include m bits of data and n bits of error correction code (ECC), for a given level of signal-to-noise ratio, the ECC decoder at the receive can detect and correct a limited set number of incorrect bits in either the data signal or the ECC and produce the correct data bits. It is understood that the ECC bits may be convolved with the data bits. However, under increased misalignment, the signal-to-noise ratio decreases and the error correction coding may be insufficient. Accordingly, as increased misalignment is detected, the error correction coding may be changed to provide larger number n1 of error correction code to correctly handle the increased number of errors. The effect is to maintain the bit transmission rate but to decrease the data word transmission rate.

Figure 5:
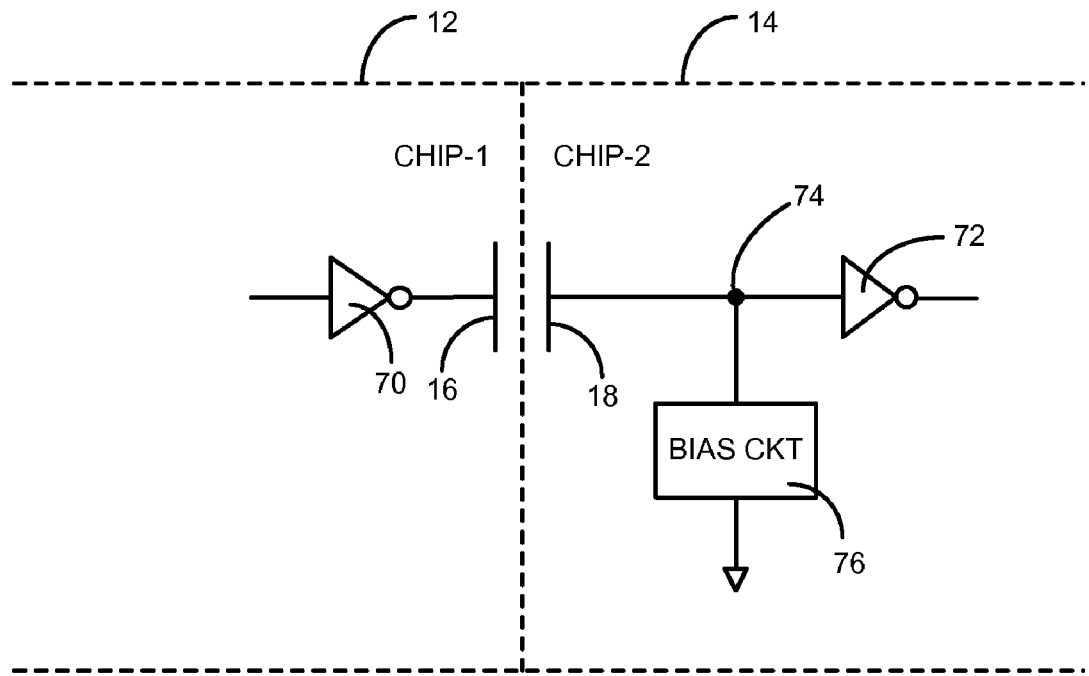
FIG. 5 is an electrical schematic of a functional representation of offset correction in the practice of an embodiment of the present invention.

In capacitively coupled digital proximity communication, increasing the bit time does not to first order increase the signal sent between two chips. This lack of increased signal arises because the channel transmits a displacement current only as long as the transmitter is slewing. As illustrated in the circuit diagram of FIG. 5, an inverting transmitter 70 is capacitively coupled to an inverting receiver 72 through their respective pads 16, 18 forming a capacitive coupling circuit across a dielectric gap. Once the transmitter 70 finishes slewing, the receiver 72 sees no more current, regardless of how long it waits. However, in such a system, an increased bit time can be used to reduce noise on the receiver, thus increasing the signal-to-noise ratio. The receiver 72 needs to detect a small signal transition and hence is typically designed with very high input impedance. As a result, a receive node 74 tends to float and develop an offset at the input to the receiver 72. Accordingly, a bias circuit 76 is often used to prevent the input node 74 from drifting. The bias circuit 76 may assume the simple form of a leaky off transistor, as disclosed by Schauer et al. in U.S. patent application Ser. No. 11/651,221, filed Jan. 6, 2006. More complex offset correcting is possible, as disclosed by Bosynak et al. in U.S. Pat. No. 6,396,308, and may be incorporated into the receiver. Most designs involve some form of integrating or averaging the input signal so that the offset correction sets a minimum bit time.

Figure 6:
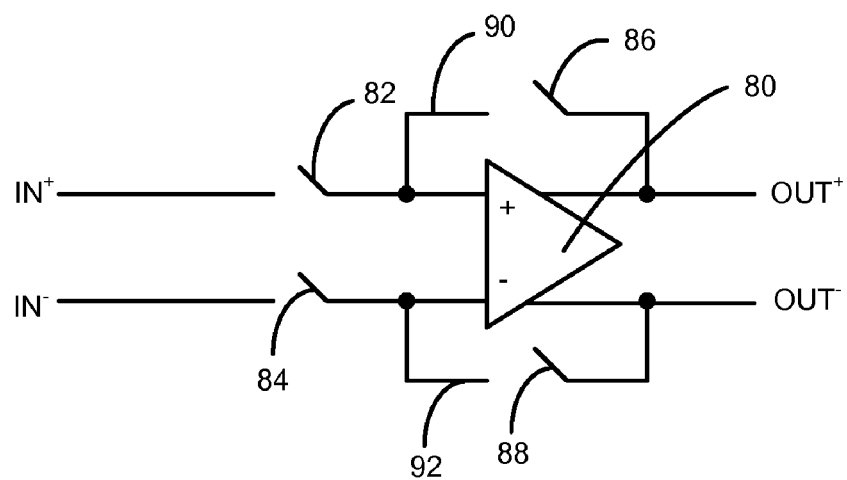
FIG. 6 is a circuit diagram of a complex offset correction in the practice of an embodiment of the invention.
Figure 7:
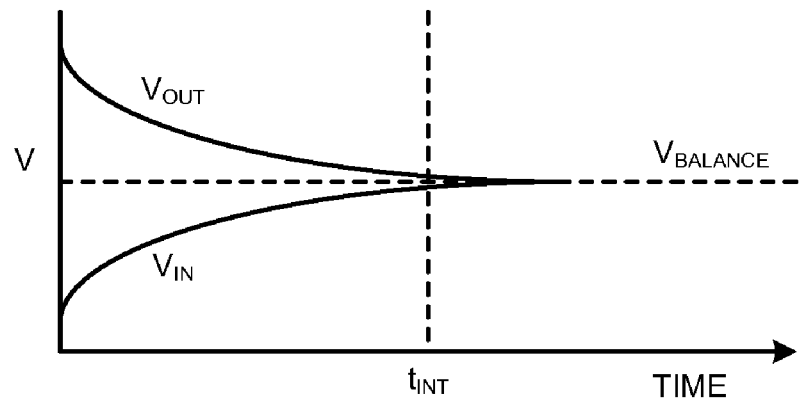
FIG. 7 is a timing diagram illustrating the operation of the circuit of FIG. 6.

Because much of the noise in a proximity communication channel is related to mismatch and offsets in the receiver circuit, this noise reduction with increased bit times can be effected by utilizing a more complex, more time-consuming circuit for offset-compensation. Many methods for offset compensation require integration of charge during a time period, so increasing this time period may make the charge integration more precise. As illustrated in the circuit diagram of FIG. 6, the receiver is often implemented as a differential amplifier 80 receiving positive and negative inputs in+ and in− of the same signal coupled to the receive chip through paired sets of pads and producing complementary outputs out+ and out−. Both the inputs in+ and in− are typically connected to gates of equivalent MOS transistors. If the two MOS transistors do not have exactly equal threshold voltages $V_T$, the two outputs out+ and out− will be offset from each other by the difference in their $V_T$. The difference may be visualized as an extra voltage source imposed on the inputs to the differential amplifier 80. The result, as illustrated in the timing diagram of FIG. 7, is that at time t=0, the output voltage $v_{OUT}$ is offset from the input voltage $v_{IN}$.

An active method of correcting the offset is to balance the input to the output. Periodically, for example every clock cycle in the embodiment of FIG. 6, input switches 82, 84 on the two amplifier inputs are disconnected and feedback switches 86, 88 are connected on feedback loops 90, 92 from the outputs to the respective inputs of the differential amplifier 80. The feedback can be performed, but need not be, as often as every clock cycle. The feedback causes the input voltages $v_{IN}$ and output voltages $v_{OUT}$ to approach over time a common balance voltage $v_{BALANCE}$ determined by the threshold voltage $V_T$ and to thereby correct the offset. However, perfect matching is obtained only with very long integration times. If the integration time $T_{INT}$ is held to a reduced value, the correction is incomplete. The incomplete correction may be satisfactory with high signal and low noise, but as misalignment of the pads increases, the incomplete correction may become unsatisfactory. In this case, more correction may be obtained if the integration time $i_{INT}$ is increased at a cost in increased bit period and reduced bandwidth. Under typical alignment, such precision may be overkill and wasteful, but under misalignment, it may enable significant noise reduction.

Figure 8:
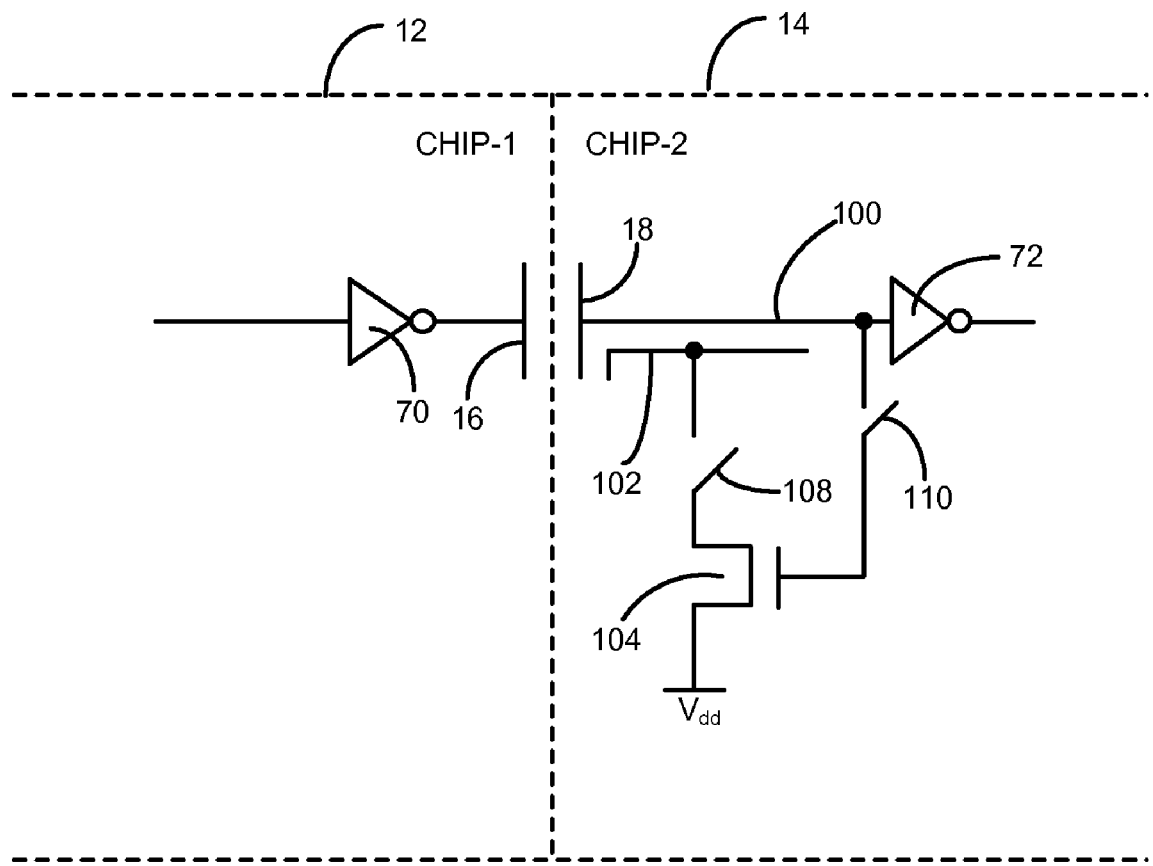
FIG. 8 is a circuit diagram of a source follower used for compensating a degraded signal resulting from excess parasitic capacitance.

In another example of longer bit periods, the driver can actively cancel parasitic capacitance. As illustrated in the electrical circuit diagram of FIG. 8, the receive pad 18 and its electrical interconnect 100 to the receiver 72 on a proximity communication channel has "useful" capacitance upwards to the transmit pad 16 of the other chip 12 and "useless" capacitance downwards to one or more metal layers 102 formed in the receive chip 14 under the receiver pad 18 and the interconnect 100. Canceling this backside capacitance may be done by driving an AC replica of the data signal to the metal layer 102. For example, a source follower on the receive chip 14 includes a MOS transistor 104 having its gate switchably connected to the interconnect 100 receiving the signal from the receive pad 18, its source switchably connected to the metal layer 102, and its drain connected to the power supply voltage Vdd. The source follower drives the metal layer 102 with a signal that is offset from the data signal on the interconnect 100 and input to the receiver by a threshold voltage of the MOS transistor 104 as long as the gate-source voltage is greater than the threshold voltage. Although the parasitic capacitance persists, it has minimum effect on the modulated signal received on the receive pad 18. This technique can increase the received signal by two to three times, but requires longer bit times due to the slow response of the source follower. Switches 108, 110 can disconnect the source follower when it is not needed so as to retain the full data rate under good alignment. This technique is complementary to canceling receiver offset with extra bit time.

Note that increasing the bit time may be directly useful in integrating more signal, thus increasing signal-to-noise ratio directly. This pertains to communication techniques different from that described above, and is the topic of the next subsection.

Decreasing Temporal Bandwidth

By changing the nominal signaling method and associated circuits used by proximity communication, one may trade off received signal strength and effective bit rate.

Figure 9:
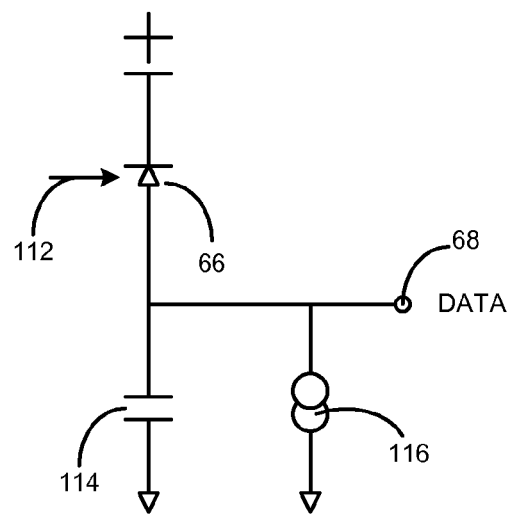
FIG. 9 is a circuit diagram of an optical receiver usable with many embodiments of the invention.

In optical proximity communication, one such method for decreasing the bit rate in view of reduced received signal strengths includes an integrating optical receiver at the receiving chip. In one embodiment of such a receiver, as schematically illustrated in FIG. 9, optical input power 112 emitted from the paired optical transmitter 60 of FIG. 4 on the other chip is converted by the photo-diode 66 to charge, which is collected in a capacitor 114 but is drained by a constant current source 116 set to the average of the photo-currents for 0 and 1 data signals. The length of the integration time, that is, the length of the bit period, determines the strength of the detected electrical signal. In this manner, the longer the charge is integrated for each bit, the higher the signal but the slower the communication. Thus, frequency of the data rate can be directly traded for a given voltage on the integrating capacitor 114.

The above discussion has assumed that while the amplitude of the signal may vary, the information is encoded in a digital, discrete time manner. Alternatively, pulse coding techniques within proximity communication send analog information in the temporal domain with varying amplitude signals and also gracefully trade off bandwidth as a function of alignment.

Figure 10:
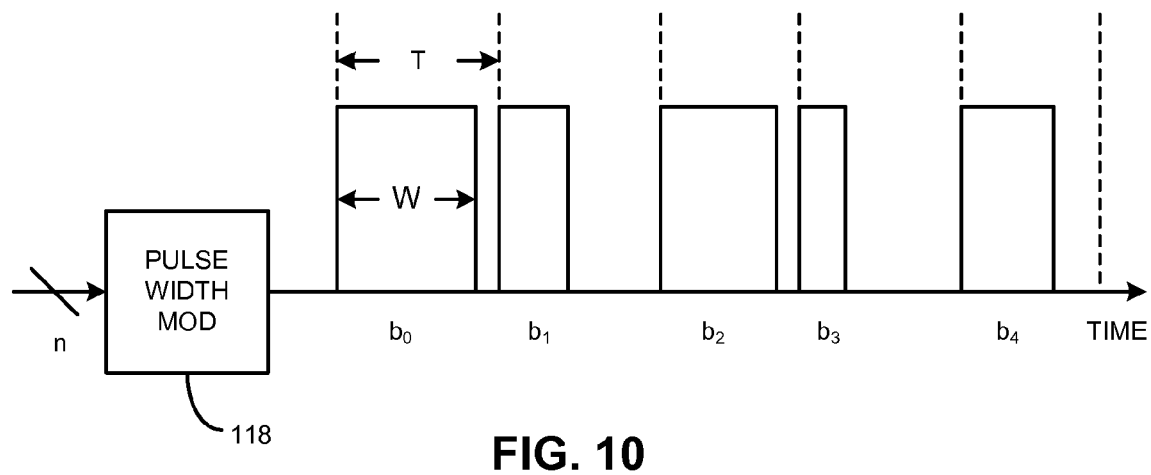
FIG. 10 is a combined circuit and timing diagram explaining the operation of a pulse width modulation communication system in conformance with some embodiments of the invention.

One exemplary method uses optical pulse width modulation (PWM) of information to communicate the pulse width modulated data across the gap between chips. As illustrated in the circuit diagram of FIG. 10 for the transmitter, a pulse width modulator 118 receives an n-bit data signal every clock period T and accordingly outputs to the electrical communication line a pulse with a width W proportional to the value of the data signal. Successive n-bit data signals give rise to different pulses, here labeled as b0, b1, b2, b3, etc. The width W or duty cycle W/T of the data pulse determines the value of the corresponding n-bit data signal. The n-bit data signal may be an n-wide bus or a fast serial line operating n times faster than the output of the modulator 118. Many PWM receivers exist in the prior art. In one example, the receiver may use the received pulse to gate a given current to a collecting capacitor, similar to the arrangement of FIG. 9, and the total charge or voltage integrated on the capacitor is measured for the multi-bit value of the data. The integration time determines the amplitude of the analog information for a given accuracy. For example, for n=4 or 4 bits of information, there are 16 possible values of the pulse widths being transmitted and 16 discrete integration times on the receiver. But, as chip separation or misalignment increases, there is less associated coupled optical power between the chips and less effective acquisition of the transmitted PWM signal. According to this embodiment of the invention, these 16 discrete time steps can be lengthened or shortened in time to generally maintain the same maximum charge collection and thus to gracefully trade integration time for a given amount of communicated information. In this embodiment, the lengthening entails changing the clock period T and, hence, the data rate. Other analog transmission data schemes that achieve a similar result may also be considered without loss of generality.

Decreasing Resolution of Analog-Encoded Information

A further important aspect of this inventive art can now be captured. By encoding information in the analog temporal domain, another trade off can be achieved, namely, the accuracy, vis-à-vis the number n of bits of information for a given timing window T, can be traded for the strength or alignment of the coupling elements between chips. In this manner, one may use PWM for optically coupled signals as described above, and one may communicate a constant number of symbols per second. The number of bits per symbol may degrade as the chips become misaligned.

Decreasing Spatial Bandwidth

Yet another method of degrading the proximity communication channel in order to sustain communication under misalignment comes from reduction in system bandwidth.

One way to reduce bandwidth for capacitively coupled systems is to selectively "gang together" transmit pads and receive pads in neighboring locations so that two or more pads situated side-by-side carry the same data bit, rather than two different data bits. As illustrated in the circuit diagram of FIG. 11, four proximity channels include respective transmitters 70A, 70B, 70C, 70D; respective transmit pads 16A, 16B, 16C, 16D; respective receive pads 18A, 18B, 18C, 18D; and respective receivers 72A, 72B, 72C, 72D. Additionally, each channel includes on the transmit chip 14 respective transmit cutoff switches 120A, 120B, 120C, 120D between the data inputs and the respective receivers 70A, 70B, 70C, 70D. Each channel also includes on the receive chip 14 respective receive cutoff switches 122A, 122B, 122C, 122D between paired transmit pads 18A, 18B, 18C, 18D and inputs to the receivers 72A, 72B, 72C, 72D. Yet further, transmit cross-connect switches 124A, 124B, 124C can selectively tie together inputs to neighboring ones of the transmitters 70A, 70B, 70C, 70D, and receive cross-connect switches 126A, 126B, 126C selectively tie together neighboring ones of the receive pads 18A, 18B, 18C, 18D and are located before their associated receive cutoff switches 122A, 122B, 122C, 122D.

Under good alignment, all of the receive cutoff switches 120A, 120B, 120C, 120D and all of the transmit cutoff switches 122A, 122B, 122C, 120D are turned on, and all of the transmit cross-connect switches 124A, 124B, 124C and all of the receive cross-connect switches 126A, 126B, 126C are turned off. This switch configuration provides four independent proximity channels. However, under misalignment, the first and second channels may be ganged together by turning off the cutoff switches 120B, 122B of the second channel and turning on the cross-connect switches 124A, 126A on both the transmit and receive sides of the second channel. The cutoff switches 120A, 122A on the first channel remain turned on. This switch configuration effectively disables the second channel but provides two transmitters 70A, 70B and two pairs of pads 16A, 18A and 16B, 18B for the first channel. The ganging immediately drops the data bandwidth by a factor of two because the same signal is applied to both pairs of pads 16A, 18A and 16B, 18B, but the ganging provides pads of effective size twice the normal size. Similarly, the third and fourth channels can be ganged together by appropriate circuitry to produce a single data channel if those channels are similarly misaligned.

Under even further misalignment, it is possible to tie together three channels or even more, particularly if a large number of similarly configured channels are included in the array.

In the illustrated arrangement, the two ganged channels use only a single receiver 72A receiving signals from two receive pads 18A, 18B. If the receiver 72B on one of the receive pads 18B is disconnected from the two ganged pads 18A, 18B by the switch 122B, the parasitic capacitance on the combined pad is reduced, thus increasing the received signal and benefiting the signal-to-noise ratio. Note that ganging together two pads does not immediately double the signal-to-noise ratio for a number of reasons, not the least of which is that the parasitic capacitance is partly due to the pad itself, so doubling the pads will not double the signal. If the misalignment is planar, the ganged pads can be chosen in a two-dimensional array of pads in the direction of misalignment.

The receiver 72B on the second receive pad 18B need not be disconnected. If the two receivers 72A, 72B can be combined such that signal currents from the two separate receivers 72A, 72B are summed together, for example, by a cross-connect switch after the two receivers 72A, 72B, the effect is to double the signal current. As long as noise effects are not also doubled, the summing improves signal-to-noise ratio.

In some pad arrangements designed to reduce crosstalk, this pad accretion may be more effectively done by ganging together all four pads instead of just two at a time, however, at a larger loss in bandwidth.

Alternatively, the transmit and receive pads can both be made from smaller micropads, thus enabling a finer selection of pad sizes. An important trade off in such a system is the granularity of pad size with degradation of performance due to the pad selection control circuitry.

Figure 11:
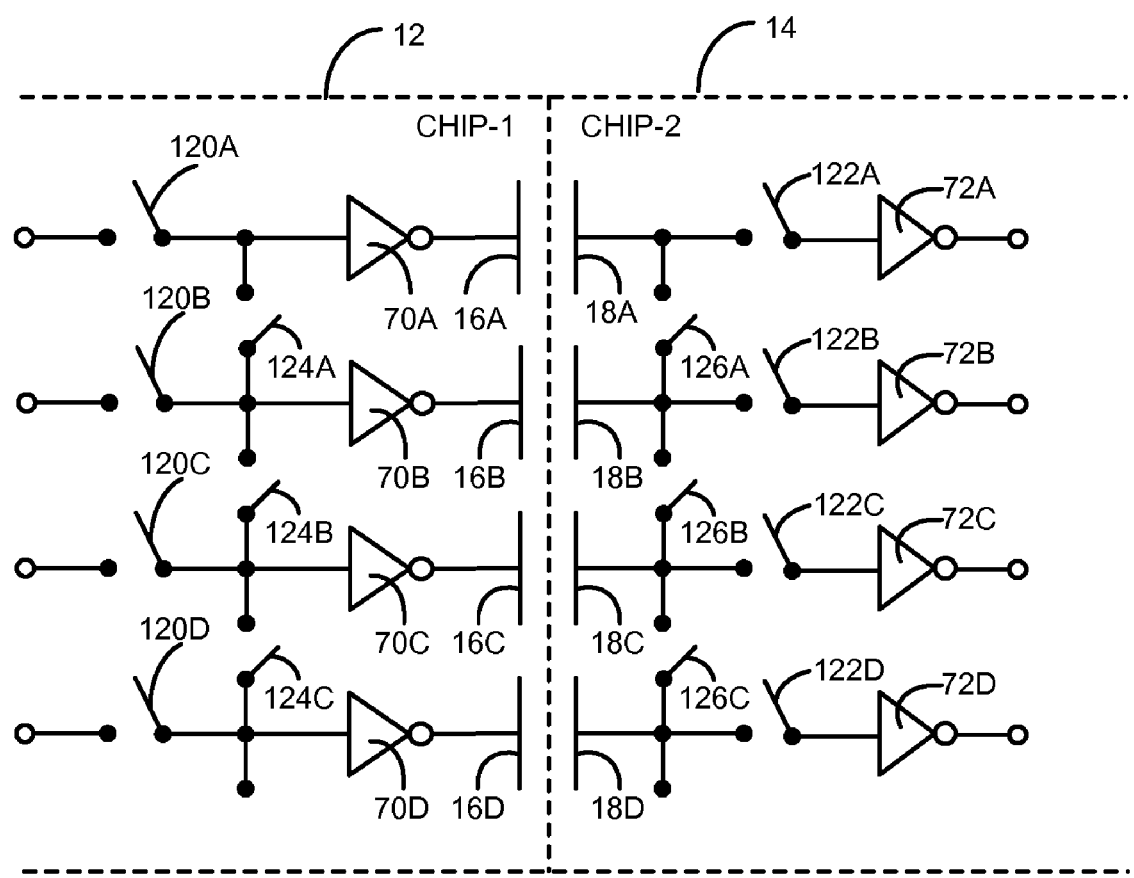
FIG. 11 is a circuit diagram of selectively ganged proximity channels according to an embodiment of the invention.

The ganging of PxC channels in FIG. 11 results in a reduction of system bandwidth while maintaining the total system power. In another embodiment, to be explained with reference to FIG. 11 but with the deletion of the illustrated switches so there is no ganging and input and output lines are unswitched, the transmitters 70A-70D of physically alternating PxC channels can be turned off as the transmit pads 16A-16D and receive pads 18A-18D become increasingly misaligned. For example, transmitters 70A, 70C are left on and receive separate data signals while transmitters 70B, 70D are turned off, thereby reducing the bandwidth by half and potentially reducing power by about half. The reduced bandwidth may increase the signal-to-noise ratio of the remaining misaligned channels because one of the effects of misalignment is to increase the cross talk between neighboring channels. For example, if the receive chip 14 is misaligned downward in FIG. 11, the receive pad 18A is increasingly coupled to and may receive signals from the two transmit pads 16A, 16B, but if the receiver 70B is turned off the receive pad 18A receives signals from only the corresponding transmit pad 16A. System power reduction is further enhanced if the corresponding receivers are turned off, for example receivers 70B, 70D in the example above.

Granularity

On a chip with multiple proximity communication channels, each channel may see different misalignments. For example, a chip may have four proximity communication channels, each on a different edge of the chip, with each channel communicating to a different partner chip. In such cases, each channel may see a different misalignment. The graceful degradation can be done differently for each channel, or degrade to different magnitudes in different channels.

In addition, a particular channel may have tens, hundreds, or thousands of bits grouped together with different pads or other coupling elements. Some of the bits in a channel may see a different misalignment from other bits in the same channel. This may happen if the partner chip is tilted, with some of the bits closer together or better aligned than other bits. In this case, the graceful degradation may be different across a single channel. In cases where the communication is moderated using handshakes (for example, using asynchronous requests and acknowledgments), this can be done with very low overhead. If a single data word has bits with different channel degradation, the receiver chip will need to re-synchronize the parts of the word after the link.

Closed System With Feedback

Figure 12:
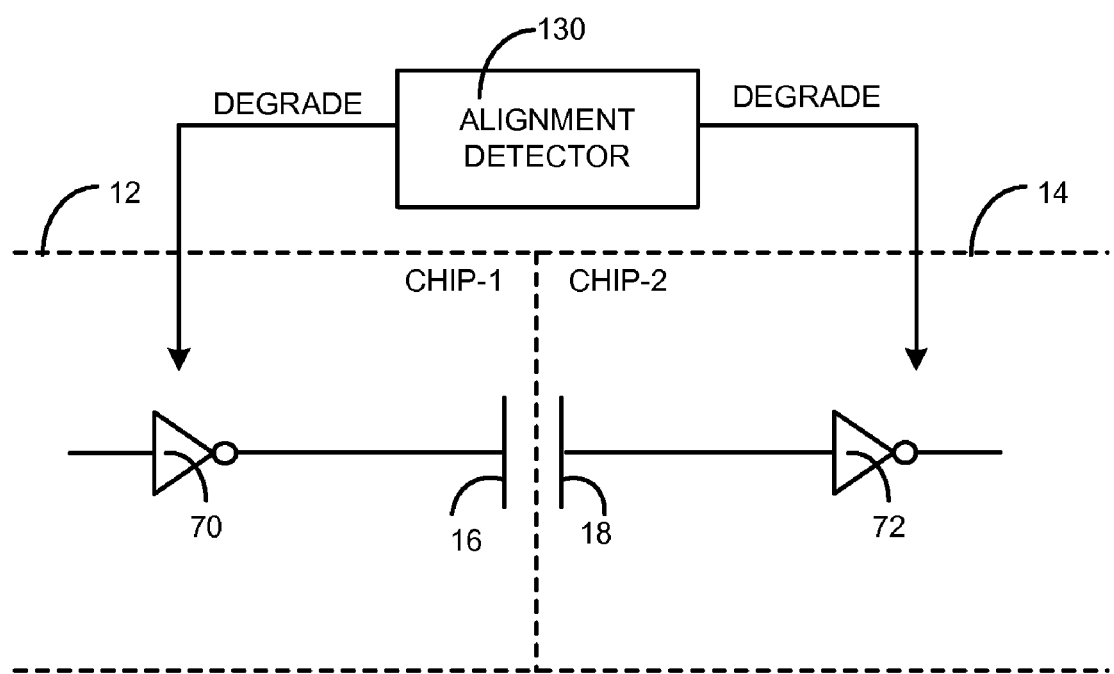
FIG. 12 is a circuit diagram of a dynamic degradation system which may be implemented with many embodiments of the invention.

This channel degradation may be part of a closed-loop system, as schematically illustrated in FIG. 12, in which an alignment detector 130 (similar to those described in prior art such as by Drost in U.S. Pat. Nos. 7,148,074 and 7,129,712) connected to a proximity communication channel determines the amount of misalignment between the two chips 12, 14 and their plural pads 16, 18 or other coupling elements. The alignment detector 130 accordingly instructs the circuitry on one or both of the chips 12, 14 to dynamically degrade or compensate according to any of the methods and apparatus covered by the invention. The channel degradation may operate dynamically to compensate for real-time chip misalignment. In such a scheme, the controlled channel degradation may wax and wane depending on the instantaneous chip misalignment, for example, as changing temperature brings the communication elements into and out of alignment.

An important design characteristic of such a system is that the very methods of channel degradation may actually affect the chip position. For example, techniques that increase channel power may increase local chip temperature and subtly affect chip alignment. This may lead to instability in the system. An example of this may result in: (a) the chip detecting misalignment; (b) the chip increasing transmit power to compensate; (c) the chip heating up and moving further out of alignment; and then (d) the power being increased even more, thus exacerbating the problem. Similar examples may be found with other methods of channel degradation.

A designer must therefore carefully consider effects of channel degradation on chip misalignment to ensure this type of instability does not occur.

Method

Proximity communication may use capacitive, inductive, optical, or conductive coupling. Because proximity communication typically use voltage-controlled transistors, in most schemes data reception ultimately relies on accumulation of charge on a capacitor. As the distance or misalignment between two communication chips increases, the amount of accumulated charge reduces and the efficacy of the communication is reduced. In capacitively coupled proximity communication, the capacitor spans the chip gap directly, and misalignment reduces the field strength between the two capacitor plates. In optically coupled proximity communication, the greater the gap between the optical fiber and the optical coupler, the lower the potential efficiency of the coupler, and hence the lower the amount of coupled light into the waveguide.

The prior art includes means for measuring this gap and measuring small relative changes in this gap. Different aspects of the invention include the method of using such gap measurements, combined with real-time compensation, for purposefully and gracefully degrading the performance of the link. One such method is performed as follows:

(a) Monitor the gap.

(b) As gap is modulated, degrade the proximity communication link by one of the means described above.

(c) The performance of the degraded link need not be constant across the four sides of the chips but may depend on angle, tilt, etc. of the chips.

(d) In an extreme case, the chip is see-sawed east-west, but is reasonably stable north-south. This results in constant or slowly varying link performance north-south, but widely varying link performance east-west.

A further modification may be required with neighboring optical and electrical proximity links because the rate of degradation required of the electrical PxC link versus that of the optical PxC link may be different. That is, perhaps an optical PxC link may be less sensitive to greater separation between chips but may be less tolerant than a corresponding electrical PxC link to lateral or angular misalignment.

Many of the compensation techniques described above are electronic signal transmission or processing mechanism in which, for example, the strength or formatting of the signal processing is affected, either directly or through supplementing or offsetting the bias of the transmitted signal.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A proximity communication system comprising:
    a first chip having a transmit element formed on a surface thereof and a data transmitter formed in the first chip and driving the transmit element with a data signal, wherein the data transmitter includes a plurality of separate transmitter circuits, each of which is configured to drive data signals of a different respective amplitude to the transmit element;
    a second chip juxtaposed to the first chip and having a receive element formed on a surface thereof and a data receiver formed in the second chip receiving the data signal from the receive element, wherein the receive element is in at least partial alignment with the transmit element to form a communication link between the first chip and the second chip; and
    an alignment detector mechanism for determining a degree of alignment between the transmit element and the receive element, and for using the determined degree of alignment to adjust the performance of the communication link in compensation for the degree of the alignment between the transmit element and the receive element;
    wherein using the determined degree of alignment to adjust the performance of the communication link involves configuring at least one of the transmitter circuits to drive data signals to the transmit element.

2. The proximity communication system of claim 1, wherein using the determined degree of alignment to adjust the performance of the communication link involves using the determined degree of alignment to adjust an amplitude of an output of the transmitter.

3. The proximity communication system of claim 1, wherein using the determined degree of alignment to adjust the performance of the communication link involves using the determined degree of alignment to adjust a data period of the transmitter and the receiver.

4. The proximity communication system of claim 3, wherein using the determined degree of alignment to adjust the performance of the communication link involves using the determined degree of alignment to adjust a bit period of the transmitter and the receiver.

5. The proximity communication system of claim 3, wherein using the determined degree of alignment to adjust the performance of the communication link involves using the determined degree of alignment to change a length of error correction code in the data period.

6. The proximity communication system of claim 1, wherein the first chip includes a plurality of transmit elements and data transmitters, wherein the second chip includes a plurality of receive elements and data receivers, and wherein the alignment detector mechanism turns off some of the transmitters associated with physically neighboring ones of the transmit elements.

7. The proximity communication system of claim 1, wherein the alignment detector mechanism adjusts a granularity of a signal transmitted between the chips.

8. The proximity communication system of claim 1, wherein the second chip includes a metal layer that is capacitively coupled to the receive element, and wherein the alignment detector mechanism includes an amplifying circuit selectively connected between the receive element and the metal layer.

9. A method of controlling a proximity communication system that includes a transmit chip having a transmit element driven by a transmitter, wherein the transmitter includes a plurality of separate transmitter circuits, each of which is configured to drive signals of a different respective amplitude to the transmit element, and a receive chip juxtaposed to the transmit chip and having a receive element coupled to the transmit element and a receiver coupled to the receive element for communicating a data signal between the transmit and receive chip, the method comprising:
    determining a degree of misalignment between the transmit element and the receive element; and using the determined degree of misalignment to adjust a level of performance of the proximity communication system;
wherein using the determined degree of misalignment to adjust the level of performance includes configuring at least one of the transmitter circuits in the transmitter to drive signals to the transmit element.

10. The method of claim 9, wherein using the determined degree of misalignment to adjust the level of performance includes using the determined degree of misalignment to adjust a level of the data signal applied to the transmit element.

11. The method of claim 9, wherein using the determined degree of misalignment to adjust the level of performance includes using the determined degree of misalignment to adjust a data rate of the data signal.

12. The method of claim 11, wherein using the determined degree of misalignment to adjust the level of performance includes using the determined degree of misalignment to adjust a bit rate of the data signal.

13. The method of claim 11, wherein using the determined degree of misalignment to adjust the level of performance includes using the determined degree of misalignment to change a size of error correction coding within the data period.

14. The method of claim 9, wherein the transmit chip includes a plurality of transmit elements driven by a plurality transmitters, and wherein the adjusting includes turning off some of the plurality of transmitters associated with neighboring ones of the plurality of transmit elements, wherein the plurality of transmit elements includes the transmit element, and the plurality transmitters includes the transmitter.

15. The method of claim 9, wherein the adjusting includes using the determined degree of misalignment to turn off a plurality of transmitters included with the transmit chip that are associated with neighboring ones of a plurality of transmit elements that are included with the transmit chip, wherein the plurality of transmitters includes the transmitter and the plurality of transmit elements includes the transmit element, and wherein the plurality of transmit elements are driven by the plurality of transmitters.

16. A proximity communication system comprising:
a first chip having one or more transmit elements formed on a surface thereof and one or more data transmitters formed in the first chip, the one or more data transmitters driving the one or more transmit elements with one or more data signals, wherein at least one of the data transmitters in the first chip includes a plurality of transmitter circuits, each of which is configured to drive data signals of a different respective amplitude to the corresponding transmit element;
a second chip juxtaposed to the first chip and having one or more receive elements formed on a surface thereof and one or more data receivers formed in the second chip receiving one or more data signals from the one or more receive elements, wherein the one or more receive elements are in at least partial alignment with the one or more transmit elements to form a communication link between the first chip and the second chip; and
an alignment detector mechanism for adjusting a performance of the communication link to compensate for a degree of alignment between the one or more transmit elements and the one or more receive elements, wherein the alignment detector mechanism includes at least one of:
a mechanism for using the degree of alignment to turn off some of the data transmitters that drive physically neighboring transmit elements;
a mechanism for using the degree of alignment to select one or more of the transmitter circuits in the at least one data transmitter in the first chip that includes the plurality of transmitter circuits to be configured to drive the corresponding transmit element with data signals;
a mechanism for using the degree of alignment to adjust a granularity of a signal transmitted between the chips; or
an amplifying circuit selectively coupled between the receive element and a metal layer on the second chip, wherein the metal layer is capacitively coupled to the receive element.

* * * * *